United States Patent [19]
Bastek

[11] 4,232,440
[45] Nov. 11, 1980

[54] CONTACT STRUCTURE FOR LIGHT EMITTING DEVICE

[75] Inventor: John J. Bastek, Reading, Pa.

[73] Assignee: Bell Telephone Laboratories, Incorporated, Murray Hill, N.J.

[21] Appl. No.: 15,717

[22] Filed: Feb. 27, 1979

[51] Int. Cl.³ .............................................. B01J 17/00
[52] U.S. Cl. .................................... 29/590; 29/569 L; 29/591
[58] Field of Search ................ 29/569L, 572, 590, 591

[56] References Cited
U.S. PATENT DOCUMENTS

| | | | |
|---|---|---|---|
| 3,808,108 | 4/1974 | Herb | 204/32 |
| 3,909,929 | 10/1975 | Debesis | 29/590 |
| 4,156,963 | 6/1979 | Tsuji | 29/590 |

*Primary Examiner*—W. C. Tupman
*Attorney, Agent, or Firm*—H. W. Lockhart

[57] ABSTRACT

A contact structure to the light emitting surface 19 of a light emitting device 10 having an array of small distributed contacts 14 is made by selectively depositing a larger area bonding pad 15 over a portion of the distributed contacts. The small contacts not covered by the bonding pad then are removed by sputter etching and contact to the device is made by wire bonding a lead 17 to the bonding pad.

7 Claims, 3 Drawing Figures

CONTACT STRUCTURE FOR LIGHT EMITTING DEVICE

BACKGROUND OF THE INVENTION

This invention relates to light emitting devices and, more particularly, to a contact structure to the light emitting surface of such devices which typically are made from III-V compound semiconductors.

Light emitting devices as well as light collecting devices previously have used small distributed ohmic contacts in various arrays to enable electrical connection to the semiconductor material and, at the same time, to enhance light transmission at the contacted surface by reducing the area covered by the contact. With such small distributed contacts, means is provided to enable facile external connection to one or more of the contacts. One advantageous arrangement comprises a large area bonding pad which overlies several of the distributed contacts and to which a wire lead may be attached, typically by thermocompression bonding. However, it is desirable then to remove the distributed contacts not contacted by the bonding pad so as not to reduce light emission unnecessarily from the contacted surface.

A process to achieve the described contact structure on compound semiconductors such as gallium phosphide, gallium arsenide, and gallium aluminum phosphide carries a number of constraints. The distributed ohmic contacts, advantageously of gold with a small percentage of beryllium, are alloyed to the semiconductor material for good ohmic contact. They therefore are of both limited thickness and area. The larger area bonding pad usually is of substantially pure gold and is applied subsequent to the alloying step. To provide just a sufficient number of distributed contacts to be placed within the area of the bonding pad presents a mask registration problem. The use of chemical etching to remove both the distributed contacts outside the bonding pad or to define the relatively thick bonding pad, is time consuming and additionally is the source of contamination. Thus, an object of the invention is a process for making contact to the top or light emitting portion of a light emitting device with a high degree of reliability and with minimum interference with light emission.

SUMMARY OF THE INVENTION

In accordance with an embodiment of the invention, an array of distributed ohmic contacts is formed on the top surface of a light emitting diode. In a specific embodiment, the upper portion of a gallium phosphide diode is of P-type conductivity and contains an array of beryllium gold contacts of very small diameter. These contacts typically are deposited by evaporation through a mask and then heated to ensure formation of a good low resistance contact. A suitable gold bonding pad of larger diameter, typically about 8 to 10 mils, then is formed by evaporating gold through a metal mask to define the bonding pad. The pad typically has a thickness an order of magnitude greater than the distributed contacts. In particular, the bonding pad is made sufficiently thick to permit removal of a portion of the pad during the subsequent process for removing the unwanted distributed contacts.

In the next step, the distributed contacts not encompassed by the bonding pad are removed by a sputter etching process comprising a bombardment of argon ions. Typically, the sputter etching process may have a duration of about twice the period necessary to remove the nominal thickness of a distributed contact to ensure complete removal of all of the ohmic contacts not covered by the bonding pads. This process removes also a corresponding thickness from the bonding pad which, as noted above, has been deposited to a thickness which allows for this factor.

Thus, the process, in accordance with the invention, enables the formation of a bonding pad of greater thickness than would be reasonable if a wet chemical etching process is used with the contamination of wet chemistry, thus achieving better bonding reliability and ensuring complete removal of the excess distributed ohmic contacts for enhanced light emission. Moreover, use of a thicker bonding pad enables lead bonding thereto at lower temperature and pressure than in the case of the thinner bonding pad used in the photoresist and etching process. This is particularly advantageous where the other parts of the device structure, for example the mounting contact, cannot withstand high temperatures.

BRIEF DESCRIPTION OF THE DRAWING

The invention and its other objects and features will be better understood from the following detailed description taken in conjunction with the drawing in which.

DETAILED DESCRIPTION

Figure 1:
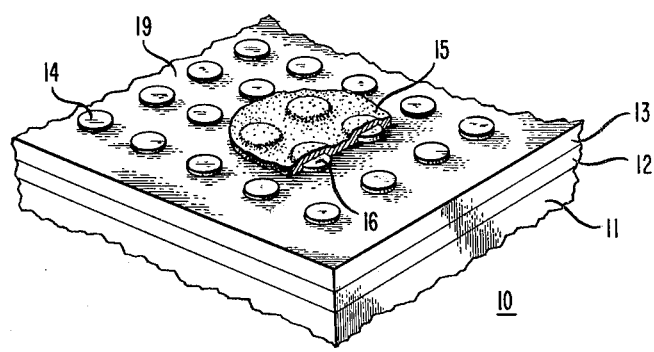
FIG. 1, 2 and 3 are perspective views of the upper portion of a light emitting device illustrating the successive steps in fabricating a contact structure thereto in accordance with this invention.

Referring to FIG. 1, there is shown the upper portion 10 of a gallium phosphide semiconductor device. In a specific embodiment the portion 11 comprises an N-type conductivity monocrystalline substrate having an N-type conductivity layer 12 and a P-type conductivity layer 13 formed thereon epitaxially. As is known, the application of a voltage across the PN junction formed at the interface of layers 12 and 13 results in the emission of radiation from the junction area.

In order to increase the light emission from the top surface 19 of the device, an array of small distributed contacts 14 is used to make ohmic contact to the P-type layer 13. Typically, these small contacts 14 are formed in a regular array by selective deposition through a metal mask. Other methods, such as plating into a suitable mask, also may be used. In a specific embodiment these contacts are of gold with a very small percentage of another metal, in this case about one percent beryllium. Moreover, in order to reduce the masking of light emission as mush as possible, these small contacts have a diameter of about 1.5 mils and are arrayed uniformly on 3.25 mil centers. Using the process in accordance with this invention, the contacts need have a thickness of only about 0.25 microns.

After the array of small contacts 14 have been deposited on surface 19, the device is heated for about 10 minutes at a temperature of approximately 575 degrees C which produces a slight alloying of sintering of each small contact with the adjoining gallium phosphide material. This produces a high quality, substantially ohmic, low resistance contact to the semiconductor material.

In order to make external connection to the distributed small contacts, a larger area, thicker metallic bonding pad 15 is formed on the surface 19 overlying a number of the distributed contacts 16. In a specific embodiment the bonding pad 15 is formed by evaporation of gold through a metal mask to produce a pad having a diameter of about 9 mils and a thickness of about 3.5 microns. Advantageously, the semiconductor material is maintained at a temperature of about 250 degrees C to enhance adhesion between the deposited gold and the gallium phosphide. The reason for the relatively large thickness of the bonding pad 15, about an order of magnitude or more greater than the thickness of the small distributed contacts, will become apparent from the subsequent step in the process.

Figure 2:
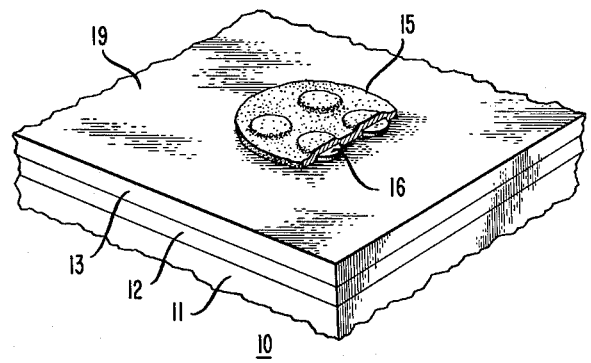

Referring to FIG. 2, the contact structure there shown is produced by subjecting the contact surface 19 of the device shown in FIG. 1 to a sputter etching process. In a typical procedure, the surface is bombarded with argon ions accelerated in an R.F. field which results in the removal of the small distributed contacts 14 not covered by the bonding pad 15 and in the removal of some gold from the upper face of the bonding pad. In a typical procedure, the sputter etching process is carried on for a period of about 40 minutes which results in the removal of some gallium phosphide surface material and some gold from the surface of the bonding pad. The relative etch rate indices for this process for the beryllium gold material is approximately 0.7 and for gallium phosphide is 1.3, taking gold at a reference value of one. Thus the beryllium gold is etched at a slower rate than either of the other two materials. The complete removal of all contacts despite variations in contact thickness is assured by sputter etching for about twice the minimum time for the nominal thickness of the gold-beryllium contacts.

Figure 3:
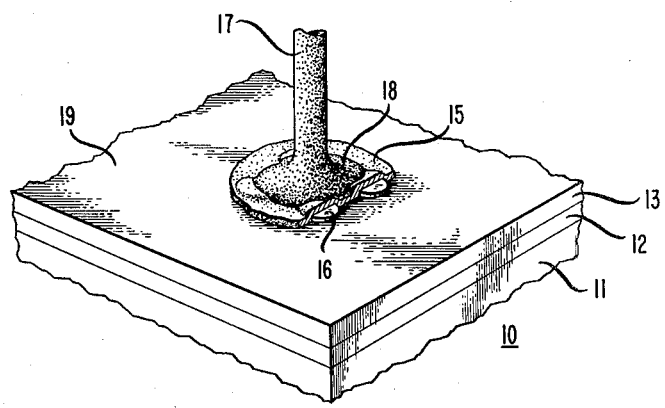

Finally, as shown in FIG. 3, external connection to the P-type conductivity material is provided by applying the wire lead 17 to the bonding pad 15 using well-known compression bonding techniques. Either thermocompression or ultrasonic bonding, or a combination of both, may be used. In a specific embodiment, the device substrate or mounting is held at a temperature of about 125 degrees C during the bonding operation which is done using an ultrasonically driven tool to produce a ball-type bond. The wire lead 17 may be fed through a tubular tool and a ball end is formed on the wire lead. The tip of the tool, vibrating at ultrasonic frequency, then produces a ball-type bond 18 to the bonding pad 15. Because of the thickness of the gold bonding pad, about three microns, good bonds are made at lower temperature and pressure, reducing the possibility of damage to the device structure. The significance of the process in accordance with this invention is illustrated particularly with respect to the reliability of the bonded wire leads. In previous practice in which the bonding pad was defined by photoresist techniques and wet chemical etching, which is used to remove the distributed contacts outside the bonding pad, bonding reliability rates did not exceed 95 percent. With the use of selectively deposited, thicker bonding pads and sputter etching, bonding yields regularly exceed 99 percent.

I claim:

1. The method of making a substantially ohmic low resistance contact to the light emitting surface 19 of a light emitting semiconductor device 10 comprising the steps of;
   (1) forming on said light emitting surface an array of small metallic contacts 14,
   (2) heating said device to alloy a portion of each said contact to said light emitting surface,
   (3) selectively depositing a large area metal bonding pad 15 on said light emitting surface and over a plurality of said small contacts,
   (4) subjecting the light emitting contact surface to sputter etching for a period of time sufficient to entirely remove the small contacts not covered by the bonding pad, and
   (5) attaching a wire lead to the surface of said bonding pad.

2. The method of making a substantially ohmic low resistance contact to the light emitting surface of a light emitting semiconductor device which is of the III–V compound semiconductor type comprising the steps of
   (1) forming on said light emitting surface a regular array of small metallic contacts,
   (2) heating said device to alloy a portion of each said contact to said light emitting surface,
   (3) selectively depositing a large area metal bonding pad on said light emitting surface and over a plurality of said small contacts, said pad having a thickness at least about an order of magnitude greater than the thickness of small contacts,
   (4) subjecting the contact surface to sputter etching for a period sufficient to entirely remove the small contacts not covered by the bonding pad, and
   (5) attaching a wire lead to the surface of said bonding pad.

3. The method in accordance with claim 2 in which said small metallic contacts are an alloy of gold and beryllium and said bonding pad is gold.

4. The method in accordance with claim 2 in which the semiconductor material is one selected from the group consisting of gallium arsenide, gallium phosphide, and gallium alluminum phosphide.

5. The method in accordance with claim 2 in which said small metallic contacts have a diameter of about 1.5 mils and are spaced about 3.25 mils apart, and said bonding pad has a diameter of about 9 mils.

6. The method in accordance with claim 2 in which said sputter etching comprises a process of bombardment using argon ions.

7. The process in accordance with claim 2 in which said wire lead is attached to the surface of said bonding pad by thermocompression and/or ultrasonic bonding.

* * * * *